United States Patent [19]

Steely

[11] Patent Number: 4,786,822
[45] Date of Patent: Nov. 22, 1988

[54] LOAD CONTROL SYSTEM

[75] Inventor: Lee W. Steely, Reinholds, Pa.

[73] Assignee: AMP Incorporated, Harrisburg, Pa.

[21] Appl. No.: 64,917

[22] Filed: Jun. 19, 1987

[51] Int. Cl.[4] .................... H01H 47/00; H02M 3/337
[52] U.S. Cl. .................................... 307/125; 363/17; 318/681
[58] Field of Search ................... 307/125, 140, 141.4, 307/117, 254; 363/17, 34, 49, 132; 318/599, 681, 689, 293

[56] References Cited

U.S. PATENT DOCUMENTS 4,586,118  4/1986  Mihalka .......................... 363/49 X Primary Examiner—William M. Shoop, Jr.
Assistant Examiner—Sharon D. Logan

[57] ABSTRACT

A load control system (10) generates a periodic failsafe signal (CO) and two control signals. The failsafe signal (CO) is used to drive a charge (20) pump which acts as a voltage multiplier to generate an enable signal. A DC bridge circuit (30) includes four n-channel MOSFETs (Q1-Q4), and the load control signals are used to close respective diagonally opposed pairs of the MOSFETs to apply voltage to a load. The load control signals also isolate selected switch drivers (K1-K4) from a power supply in order to prevent shorting of the bridge (30). The enable signal generated by the charge pump (20) is applied to two of the MOSFETs, and voltages are selected such that the MOSFETs will not close unless the enable signal is at a sufficiently high level to indicate proper oscillation of the failsafe signal (CO).

17 Claims, 2 Drawing Sheets

LOAD CONTROL SYSTEM

BACKGROUND OF THE INVENTION

This invention relates to load control systems such as bridge circuits, and in particular to improvements which provide failsafe protection.

One type of commonly used load control system includes a bridge circuit which can be controlled to apply a voltage of either polarity to a load such as a motor. U.S. Pat. Nos. Iordanidis, 3,525,883, Korte, 4,066,945, Levine, 4,063,141, Cathell, 4,105,957, Black, 4,298,926, Kade, 4,545,004, and Damiano, 4,616,305 provide examples of several prior art circuits.

Load control systems incorporating such bridge circuits are subject to two potential failure modes. First, a failure in the system controller can inadvertently cause the load to be powered for an excessively long time period. For example, a load control system which uses a controller to set latches in a remote station to control a load can suffer a controller failure which leaves the latches set. Watchdog timers have been used in the past to remove voltage from the load if the controller fails to generate a periodic failsafe signal. One object of this invention is to provide a failsafe system which can be used in conjunction with a bridge circuit comprising four n-channel MOSFETs without significantly increasing the cost or complexity of the overall system.

Another failure mode of bridge circuits is that improper operation of the switches (due, for example to electromagnetic interference or controller failure) can create a direct short through the bridge circuit. Such a short, if it lasts for any appreciable time, can of course destroy the bridge circuit. The Iordanidis and Korte patents mentioned above recognize this problem, and both disclose feedback systems that are responsive to the voltage drop across the load or the current passing through the bridge to prevent three or more of the switches from being closed simultaneously. This approach is responsive to the controlled current rather than to the load control signals, and for this reason is only indirectly responsive to the load control signals themselves. It is an object of this invention to provide a circuit which simultaneously applies each of the load control signals to close a pair of diagonally opposed switches and to disable the complementary pair of switches, thereby preventing short circuits in the bridge.

SUMMARY OF THE INVENTION

According to a first feature of this invention, a circuit for applying a supply voltage to a load in a load control system of the type comprising means for generating a load control signal and means for generating a failsafe signal is provided with means, responsive to the failsafe signal, for generating an enable signal. The enable signal has a voltage higher than that of the supply voltage when the failsafe signal is present and a voltage substantially lower than that of the supply voltage when the failsafe signal is absent. At least one digital switch is adapted to control current to the load, and this switch is responsive to a gating signal such that the digital switch is maintained in a nonconductive state when the gating signal has a voltage lower than the supply voltage, and the digital switch is maintained in a conductive state when the gating signal has a voltage greater than a threshold voltage which is in turn greater than the supply voltage. The enable signal is selectively applied to the digital switch as the gating signal such that the digital switch is prevented from entering the conductive state except when the failsafe signal is present.

According to a second feature of this invention a bridge circuit, which may incorporate the failsafe feature described above, is responsive to first and second load control signals. The load control signals are used both to control the digital switches of the bridge so as to close selected ones of the switches and to disable selected other ones of the switches in order to prevent short circuits in the bridge circuit.

Both features of the invention can advantageously be combined as in the preferred embodiment described below. This embodiment includes four n-channel MOSFETs which provide the important advantage of extremely low operating resistance. However, when four n-channel MOSFETs are used in a bridge configuration to switch a supply voltage, a voltage higher than the supply voltage is required to control two of the n-channel MOSFETs. The embodiment described below uses a charge pump to develop this higher voltage, and the charge pump is itself responsive to the failsafe signal. In this way, the important advantages of failsafe operation are provided at a minimal increase in the cost and complexity of the system. Furthermore, the anti-shorting circuit described below substantially eliminates the possibility of short circuits in the bridge. Once again, this important advantage is obtained with a minimal increase in cost and complexity of the circuitry.

The invention itself, together with further objects and attendant advantages, will best be understood by reference to the following detailed description, taken in conjunction with the accompanying drawings.

DESCRIPTION OF THE PREFERRED EMBODIMENT

Figure 1:
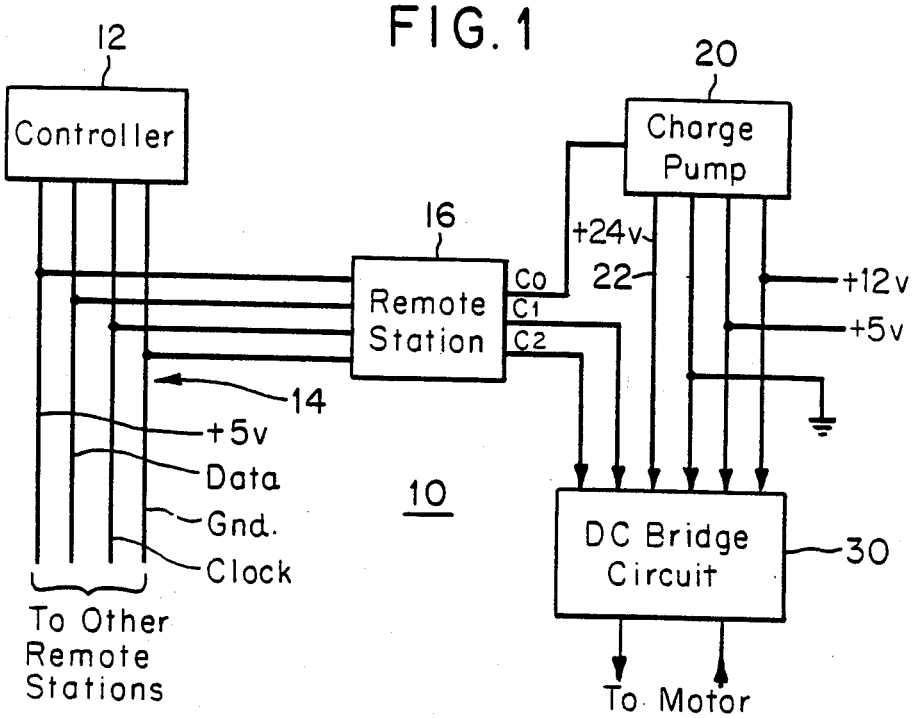
FIG. 1 is a block diagram of a load control system which incorporates a presently preferred embodiment of this invention.

Turning now to the drawings, FIG. 1 shows a block diagram of a load control system 10 which incorporates a presently preferred embodiment of this invention. The system 10 includes a controller 12 which is coupled to a plurality of remote stations 16 by a four conductor bus 14. In FIG. 1 only one of the remote stations 16 is shown. The bus 14 includes 5 VDC and 0 VDC power conductors as well as data and clock signal conductors. The remote station 16 is powered by the 5 VDC and 0 VDC conductors and it monitors signals on the data and clock conductors. The clock conductor synchronizes operation of the controller 12 and the remote station 16 and the data conductor is used for the exchange of data both from the controller 12 to the remote station 16, and from the remote station 16 to the controller 12. The remote station 16 includes a plurality of latches which are set and reset to store corresponding bits of data transmitted to the remote station 16 by the controller 12.

A wide variety of controllers 12 and remote stations 16 can be used in this embodiment, and these elements of the system have been described merely to define the environment of the present invention. By way of an example, the multiplexing system described in U.S. Pat. No. 4,508,399, assigned to the assignee of the present invention, is well-suited for use in this embodiment.

The remote station 16 generates three command signals C0, C1, C2 in accordance with respective bits of information transmitted to the remote station 16 by the controller 12. In this embodiment, the signal C0 is used as a failsafe signal, and the signals C1 and C2 are used as load control signals.

Figure 2:
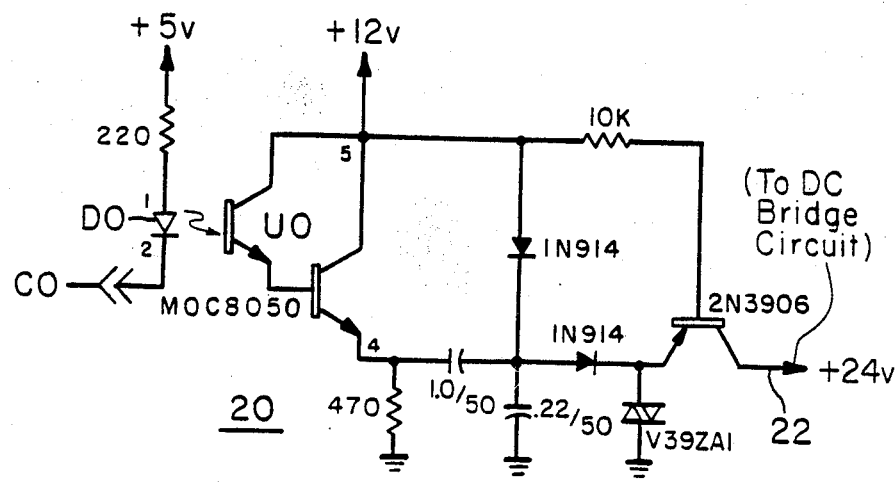
FIG. 2 is a detailed schematic diagram of the charge pump included in the embodiment of FIG. 1.

The failsafe signal C0 is applied to a charge pump 20 which also receives 12 VDC, 5 VDC and ground voltages from an external power supply (not shown). FIG. 2 shows a detailed schematic diagram of the charge pump 20. The failsafe signal C0 in this embodiment is a periodic squarewave signal which alternates between 0 VDC and 5 VDC with a duty cycle of 50% and a frequency of 250 Hz, though it should be understood that the particular frequency and waveform can vary widely. The failsafe signal C0 is applied to a LED D0 to pulse the LED D0. The pulsing light from the LED D0 switches the transistors U0, thereby driving the charge pump 20 to multiply the 12 VDC input voltage to generate an output voltage of 24 VDC on line 22. As is well known in the art, the charge pump 20 will act to multiply the 12 VDC input voltage only when the transistors U0 are periodically switched as explained above. In the event the failsafe signal C0 ceases to oscillate and remains in a steady state of either 5 VDC or 0 VDC, the output transistor coupled to line 22 is switched off and the output voltage on line 22 rapidly decreases from 24 VDC to 0 VDC. The output signal on line 22 of the charge pump 20 is used as an enable signal to enable operation of the bridge circuit 30 as described below.

Figure 3:
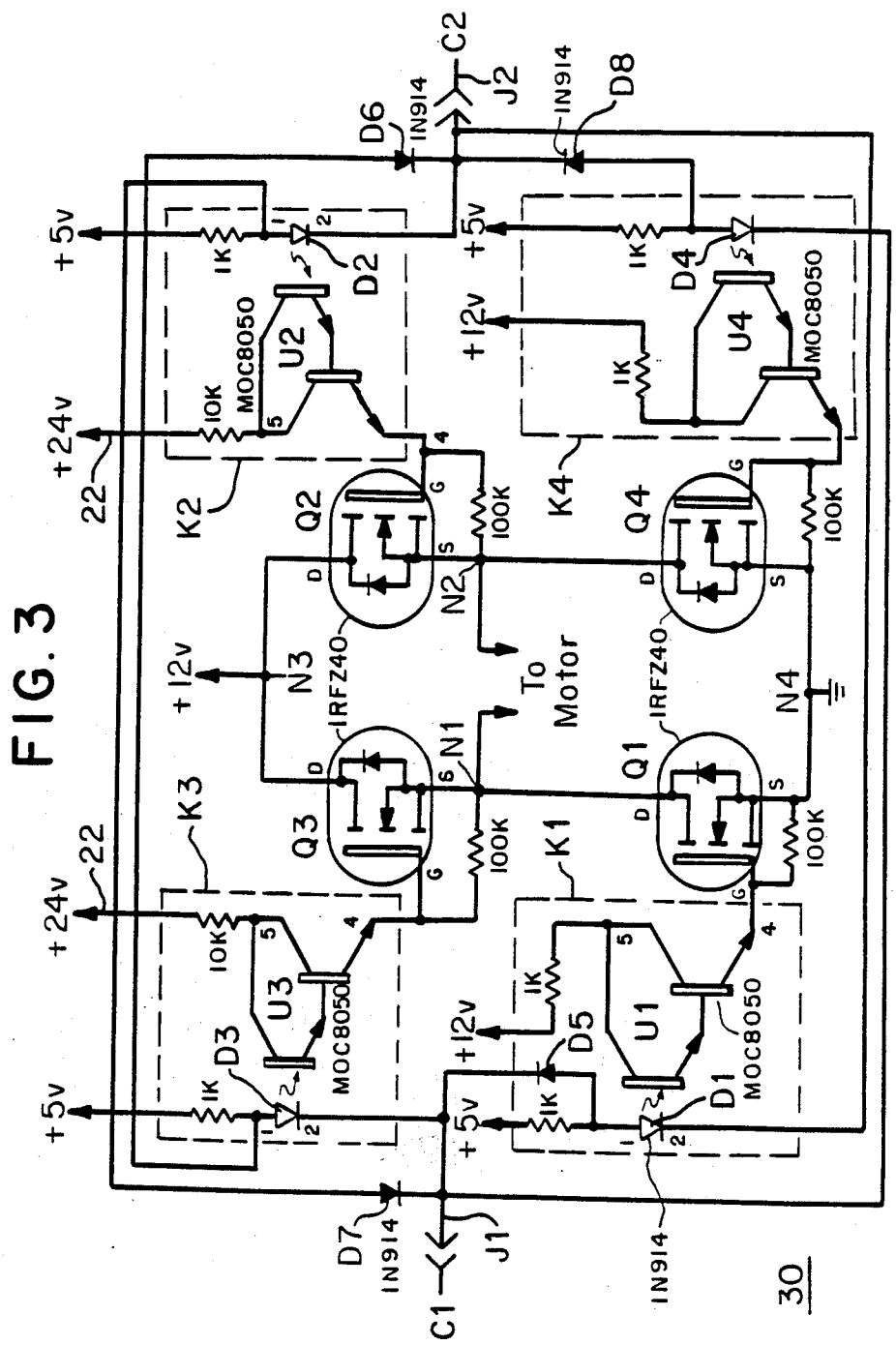
FIG. 3 is a detailed schematic diagram of the DC bridge circuit included in the embodiment of FIG. 1.

FIG. 3 provides a detailed schematic diagram of the DC bridge circuit 30 of FIG. 1. This bridge circuit 30 includes four semiconductor switches Q1–Q4, which in this embodiment each comprise a respective n-channel MOSFET. Each of the switches Q1–Q4 defines a respective gate G, source S, and drain D. The switches Q1–Q4 are arranged in a bridge configuration, with a respective node N1–N4 situated between each adjacent pair of switches Q1–Q4. Two diametrically opposed nodes N1, N2 are connected to a load to be driven, such as a motor. The remaining diametrically opposed nodes N3, N4 are connected to a 12 VDC supply voltage and ground, respectively. By properly controlling the switches Q1–Q4, a voltage differential of almost 12 VDC can be applied with either polarity to the load connected across nodes N1, N2.

The n-channel MOSFETs shown in FIG. 3 provide an electrical path between the drain D and source S when the voltage on the gate G is greater than a threshold voltage which is in turn greater than the voltage applied to the drain D. In that the drains D of the switches Q2, Q3 are connected to the 12 VDC supply voltage, this means that the voltage of the gates G of the switches Q2, Q3 must be above a threshold voltage which is greater than 12 VDC if a low resistance path is to be created between the drains D and the sources S. The switches Q2, Q3 maintain a high resistance between the drains D and the sources S when the voltage of the gates G is substantially less than the 12 VDC supply voltage.

The switches Q1–Q4 are controlled by respective switch drivers K1–K4. Each of the switch drivers K1–K4 comprises a respective LED D1–D4 and a respective coupling means U1–U4. The LEDs D1–D4 and the coupling means U1–U4 can comprise optoisolators, as shown in FIG. 3. Each of the LEDs D1–D4 is connected via a current limiting resistor to 5 VDC. The LEDs D2 and D1 are connected to a terminal J2 which is adapted to receive the load control signal C2. Similarly, the LEDs D3 and D4 are connected to a terminal J1 which is adapted to receive the load control signal C1. When the load control signals C1, C2 are in the 5 VDC state, all of the LEDs D1–D4 are in an electrical state in which substantially no light is emitted. However, when either of the control signals C1, C2 is placed in the 0 VDC state, the respective pair of LEDs D1, D2 or D3, D4 emits light. In summary, the load control signals C1, C2 are active low; when the load control signal C1 is in the 0 VDC state the LEDs D3 and D4 are illuminated; and when the load control signal C2 is in the 0 VDC state the LEDs D1 and D2 are illuminated.

The coupling means U1–U4 couple the LEDs D1–D4 to the gates G of the respective switches Q1–Q4. The enable signal on line 22 from the charge pump 20 is applied to the coupling means U2, U3 such that the enable signal (reduced by the voltage drop across the coupling means U2, U3) is applied to the gate G of the switches Q2, Q3 when the LEDs D2, D3 are illuminated, respectively. Similarly, a 12 VDC signal is applied to the coupling means U1, U4 such that 12 VDC (reduced by the voltage drop across the coupling means U1, U4) is applied to the gates G of the switches Q1, Q4 when the LEDs D1, D4 are illuminated, respectively.

The load control signals C1, C2 are also used to inhibit the closing of selected ones of the switches Q1–Q4. The terminal J1 is connected via diodes D5, D7 to nodes interposed between the LEDs D1, D2 and the 5 VDC supply, respectively. Thus, whenever the load control signal C1 is at 0 VDC the LEDs D1, D2 are effectively isolated from the VDC supply. In the 0 VDC state, the load control signal C1 acts as a current sink to ensure that the voltage drop across the LEDs D1, D2 cannot become large enough to cause the LEDs D1, D2 to illuminate. Similarly, the load control signal C2 is applied via diodes D6, D8 to LEDs D3 and D4 to ensure that when the load control signal C2 is at 0 VDC the LEDs D3, D4 are prevented from illuminating.

In the circuit described above, each of the load control signals C1, C2 simultaneously performs two separate functions:

(1) each of the load control signals C1, C2 illuminates a diagonally opposed pair of LEDs D3, D4 or D1, D2; and (2) each of the load control signals C1, C2 simultaneously disables the opposite diagonally opposed pair of LEDs D1, D2 or D3, D4 to prevent these oppositely situated LEDs from illuminating.

When one of the LEDs D2 or D3 is illuminated the corresponding coupling means U2 or U3 applies the enable signal to the gate G of the corresponding switch Q2 or Q3. Similarly, when one of the LEDs D1 or D4 is illuminated the corresponding coupling means U1 or U4 applies the 12 VDC signal to the gate G of the corresponding switch Q1 or Q4.

It is an important advantage of the embodiment described above that the disabling function performed by the load control signals C1, C2 effectively disables the respective LEDs, regardless of the state of the other of the load control signals C1, C2. That is, if both of the load controls signals C1, C2 are in the 0 VDC state simultaneously, none of the LEDs D1-D4 is illuminated.

Another important advantage of this embodiment is that each of the switches Q1-Q4 comprises an n-channel MOSFET. N-channel MOSFETs are characterized by an extremely low resistance between the drain D and the source S when the switch is closed. By using n-channel MOSFETs at each of the four switches Q1-Q4 operating resistance is minimized.

A third important advantage is that the failsafe signal C0 provides important failsafe protection without complicating the load control system to any significant extent. This is because the n-channel MOSFETs used for the switches Q2, Q3 require a voltage greater than 12 VDC at the gate G to close the switches Q2, Q3, and thus some means for providing a voltage higher than 12 VDC must be provided. In the past, charge pumps and other voltage multipliers have been used to perform this function. A charge pump requires an oscillating control signal of some type, and the embodiment described above utilizes the failsafe signal C0 for this purpose. In the event the failsafe signal C0 fails to oscillate for any reason whatsoever (as for example due to a failure of the controller 12, the bus 14, or the remote station 16), the enable signal on line 22 will quickly fall from 24 VDC to 0 VDC. At this lower level the enable signal is not at a sufficiently high voltage to close the switches Q2, Q3. Thus, any failure in the load control system which interrupts the periodic oscillation of the failsafe signal C0 ensures that the switches Q2, Q3 remain off and that no voltage is applied to the motor or other load interposed across nodes N1, N2.

In operation the controller 12 causes the failsafe signal C0 to alternate states periodically at a frequency of 250 Hz. The load control signals C1, C2 are normally in the logic high state (5 VDC). When it is desired to drive the motor in a first direction, the load control signal C1 is placed in the logic low state (0 VDC). This causes LEDs D3, D4 to be illuminated and switches Q3, Q4 to be closed. When it is desired to drive the motor in the opposite direction, the load control signal C1 is placed in the logic high state and the load control signal C2 is placed in the logic low state. This causes LEDs D3, D4 to stop generating light and diodes D1, D2 to be illuminated. This in turn cause the switches Q3, Q4 to be opened and switches Q1, Q2 to be closed.

From the foregoing description it should be apparent that a DC bridge circuit has been described which provides important advantages in terms of low operating resistance, excellent reliability against shorting of the bridge, and failsafe protection against a failure of the controller. The failsafe feature of this invention is not limited to use in a four switch bridge, but can rather be used in other applications in which switches such as n-channel MOSFETs, must be controlled reliably. The anti-shorting feature of this invention is also not limited to use with MOSFETs, and can be used with a wide variety of digital switches, including bipolar transistors, relays, and JFETs. As pointed out above, the present invention can be used with a wide variety of load control systems in addition to the specific system described above.

It is therefore intended that the foregoing detailed description be regarded as illustrative rather than limiting, and that it be understood that it is the following claims, including all equivalents, which are intended to define the scope of this invention.

I claim:

1. A circuit for applying a supply voltage to a load in a load control system of the type comprising means for generating a load control signal and means for generating a failsafe signal, said circuit comprising:
   means, responsive to the fail safe signal, for generating an enable signal, said enable signal having a voltage higher than that of the supply voltage when the failsafe signal alternates in time periodically and a voltage substantially lower than the supply voltage when the failsafe signal fails to alternate in time periodically;
   at least one digital switch adapted to control current to the load, said switch responsive to a gating signal such that the digital switch is maintained in a non-conductive state when the gating signal has a voltage substantially less than the supply voltage and the digital switch is maintained in a conductive state when the gating signal has a voltage greater than a threshold voltage which is in turn greater than the supply voltage; and
   means, responsive to the load control signal, for selectively applying the enable signal to the digital switch as the gating signal such that the digital switch is prevented from entering the conductive state except when the failsafe signal is present.

2. The invention of claim 1 wherein the means for generating the enable signal comprises a voltage multiplier circuit driven by the failsafe signal to generate the enable signal.

3. The invention of claim 2 wherein the voltage multiplier circuit comprises a charge pump.

4. The invention of claim 1 wherein the digital switch comprises an n-channel MOSFET.

5. The invention of claim 1 wherein the means for applying the enable signal to the digital switch comprises an optoisolator responsive to the load control signal.

6. A bridge circuit for applying a supply voltage to a load in a load control system of the type comprising means for generating a load control signal and means for generating a failsafe signal, said bridge circuit comprising:
   four n-channel MOSFET digital switches arranged in a bridge having first and second pairs of diagonally opposed nodes, each of said switches having a gate terminal;
   means for connecting the supply voltage across the first pair of diagonally opposed nodes;
   means for connecting a load across the second pair of diagonally opposed nodes;
   means, responsive to the failsafe signal, for generating an enable signal, said enable signal having a voltage higher than that of the supply voltage when the failsafe signal alternates in time periodically and a voltage substantially lower than the supply voltage when the failsafe signal fails to alternate in time periodically;
   means, responsive to the load control signal, for selectively applying the enable signal to the gate terminals of selected ones of the digital switches;
   said selected ones of the digital switches responsive to the enable signal such that the selected ones of the digital switches remain in a non-conductive state when the enable signal has a voltage lower than the supply voltage, thereby isolating the load from the supply voltage when the failsafe signal is absent.

7. The invention of claim 6 wherein the means for generating the enable signal comprises a voltage multiplier circuit driven by the failsafe signal to generate the enable signal.

8. The invention of claim 7 wherein the voltage multiplier circuit comprises a charge pump.

9. The invention of claim 6 wherein the means for applying the enable signal to the gate terminals comprises an optoisolator responsive to the load control signal.

10. In a bridge circuit of the type comprising four switches circuited to define four nodes, means for applying a supply voltage across a first pair of opposed nodes, and means for connecting a load across a second pair of opposed nodes, the improvement comprising:
four switch drivers, each coupled to a respective one of the switches to control the respective switch, each driver comprising an active electrical component characterized by a first electrical state when a voltage in a first range is applied across the component and a second electrical state when a voltage in a second range is applied across the component, and means for coupling the component to the respective switch such that the switch is closed when the component is in the first state and the switch is opened when the component is in the second state;
means for receiving first and second control signals, each characterized by an active state and an inactive state;
first means for coupling the first control signal to a first diagonally opposed pair of the active electrical components to apply a voltage across the respective active electrical components in the first range when the first control signal is in the active state and to apply a voltage across the respective active electrical components in the second range when the first control signal is in the inactive state;
second means for coupling the second control signal to a second diagonally opposed pair of the active electrical components to apply a voltage across the respective active electrical components in the first range when the second control signal is in the active state and to apply a voltage across the respective active components in the second range when the second control signal is in the inactive state;
first means for applying the first control signal to the second diagonally opposed pair of active electrical components to ensure that the voltage across the respective active electrical components remains in the second range when the first control signal is in the active state, thereby ensuring that the respective active electrical components are maintained in the second state, regardless of the state of the second control signal; and
second means for applying the second control signal to the first diagonally opposed pair of active electrical components to ensure that the voltage across the respective active electrical components remains in the second range when the second control signal is in the active state, therby ensuring that the respective active electrical components are maintained in the second state, regardless of the state of the first control signal.

11. The invention of claim 10 wherein the active electrical components comprise LEDs, wherein the LEDs emit light in the first state, and wherein the LEDs emit substantially no light in the second state.

12. The invention of claim 11 wherein each of the switches comprises a respective MOSFET.

13. The invention of claim 12 wherein each of the LEDs is conneted to a voltage source, wherein the active state of the control signals is at a lower voltage than the voltage source, and wherein the first and second coupling means comprise means for coupling the control signals to the respective LEDs such that current flows from the voltage source through the respective LEDs to the receiving means when the control signals are in the active state.

14. The invention of claim 13 wherein the first and second applying means comprise means for applying the control signals to the respective LEDs between the LEDs and the voltage source to isolate the LEDs from the voltage source when the control signals are in the active state.

15. The invention of claim 14 wherein the first and second applying means each comprise a pair of diodes, each interposed between the respective receiving means and a respective one of the LEDs.

16. A circuit for applying a supply voltage to a load in a load control system of the type comprising means for generating a load control signal and means for generating a failsafe signal, said circuit comprising:
means, responsive to the failsafe signal, for generating an enable signal, said enable signal having a voltage higher than that of the supply voltage when the failsafe signal is present and a voltage substantially lower than the supply voltage when the failsafe signal is absent;
at least one digital switch adapted to control current to the load, said switch responsive to a gating signal such that the digital switch is maintained in a non-conductive state when the gating signal has a voltage substantially less than the supply voltage and the digital switch is maintained in a conductive state when the gating signal has a voltage greater than a threshold voltage which is in turn greater than the supply voltage; and
means, responsive to the load control signal, for selectively applying the enable signal to the digital switch as the gating signal such that the digital switch is prevented from entering the conductive state except when the failsafe signal is present;
said applying means comprising an opto-isolator responsive to the load control signal.

17. A bridge circuit for applying a supply voltage to a load in a load control system of the type comprising means for generating a load control signal and means for generating a failsafe signal, said bridge circuit comprising:
four n-channel MOSFET digital switches arranged in a bridge having first and second pairs of diagonally opposed nodes, each of said switches having a gate terminal;
means for connecting the supply voltage across the first pair of diagonally opposed nodes;
means for connecting a load across the second pair of diagonally opposed nodes;
means, responsive to the failsafe signal, for generating an enable signal, said enable signal having a voltage higher than that of the supply voltage when the failsafe signal is present an a voltage substantially lower than the supply voltage when the failsafe signal is absent;
means, responsive to the load control signal, for selectively applying the enable signal to the gate terminals of selected ones of the digital switches;
said selected ones of the digital switches responsive to the enable signal such that the selected ones of the digital switches remain in a non-conductive state when the enable signal has a voltage lower than the supply voltage, thereby isolating the load from the supply voltage when the failsafe signal is absent;
said applying means comprising an opto-isolator responsive to the load control signal.

* * * * *